US006963253B2

(12) United States Patent
Kovac et al.

(10) Patent No.: US 6,963,253 B2
(45) Date of Patent: Nov. 8, 2005

(54) BROADBAND HIGH PRECISION CIRCULAR POLARIZERS AND RETARDERS IN WAVEGUIDES

(75) Inventors: John M. Kovac, Chicago, IL (US); John E. Carlstrom, Chicago, IL (US)

(73) Assignee: University of Chicago, Chicago, IL (US)

( * ) Notice: Subject to any disclaimer, the term of this patent is extended or adjusted under 35 U.S.C. 154(b) by 215 days.

(21) Appl. No.: 10/369,154

(22) Filed: Feb. 18, 2003

(65) Prior Publication Data

US 2003/0227344 A1 Dec. 11, 2003

Related U.S. Application Data

(60) Provisional application No. 60/357,597, filed on Feb. 15, 2002.

(51) Int. Cl.[7] .................................................. H03H 9/00
(52) U.S. Cl. ...................... 333/21 A; 333/137; 333/135
(58) Field of Search ................................ 333/125, 137, 333/21 A, 135, 113

(56) References Cited

U.S. PATENT DOCUMENTS

| | | | | |
|---|---|---|---|---|
| 2,464,269 A | * | 3/1949 | Smith | 343/911 R |
| 3,720,947 A | * | 3/1973 | Meyer et al. | 343/756 |
| 4,918,049 A | * | 4/1990 | Cohn et al. | 505/210 |
| 4,965,868 A | * | 10/1990 | Wong et al. | 343/756 |
| 5,576,668 A | | 11/1996 | Clark et al. | 333/21 A |
| 6,097,264 A | | 8/2000 | Vezmar | 333/21 |
| 6,166,610 A | | 12/2000 | Ramanujam et al. | 333/21 |

OTHER PUBLICATIONS

Lier, "*A Novel Type of Waveguide Polarizer with Large Cross–Polar Bandwidth*," IEEE Transactions on Microwave Theory and Techniques, vol. 36, No. 11, Nov. 1988, pp. 1531–1534.

Uher et al., "*Waveguide Components for Antenna Feed Systems: Theory and CAD*," Artech House, 1993, pp. 418–433.

Makarenko, "*Single–Band Varactor Polarization Modulator*," Izvestiya VUZ. Radioelektronika, vol. 20, No. 10, 1977, pp. 55–63.

Lier, "*An Extremely Broad–Band Waveguide Polarizer*," AP–S Intl. Symp. Digest: Antennas and Propagation, vol. 3, Jun. 1988, pp. 1286–1289.

"*Linear Circular Polarizers, Switchable Polarizers and Circular–to–Rectangular Waveguide Adapters*," Millitech, LLC Datasheet [online] [retrieved on Apr. 29, 2003]. Retrieved from the Internet <URL: www.millitech.com/pdfs/datasheets/007.pdf>.

Yoneda et al., "*A Design of Novel Grooved Circular Waveguide Polarizers*," IEEE Transactions on Microwave Theory and Techniques, vol. 48, No. 12, Dec. 2000, pp. 2446–2451.

Pancharatnam, "*Achromatic Combinations of Birefringent Plates—Part I. An Achromatic Circular Polarizer*," Proceedings of the Indian Academy of Sciences, Section A, vol. A41 (1955), pp. 130–136.

(Continued)

*Primary Examiner*—Robert Pascal
*Assistant Examiner*—Kimberly Glenn
(74) *Attorney, Agent, or Firm*—Brinks Hofer Gilson & Lione

(57) ABSTRACT

A retarder is presented for application in systems that transmit radiation through waveguides, such as microwave or millimeter-wave systems. The retarder is a compound device comprising multiple single element retarders, each of which introduces a retardation phase between different polarization states, and each of which is set at an orientation angle. The phases and angles are selected to maximize the operational bandwidth of the compound retarder. The selection of the phases and angles may be found by solving a set of simultaneous equations.

35 Claims, 8 Drawing Sheets

OTHER PUBLICATIONS

Pancharatnam, "*Achromatic Combinations of Birefringent Plates—Part II. An Achromatic Quarter–Wave Plate*," Proceedings of the Indian Academy of Sciences, Section A, vol. A41 (1955), pp. 137–144.

Serkowski, "*Methods of Experimental Physics*," vol. 12, Part A: Astrophysics, Optical, and Infrared, Academic Press, 1974, pp. 361–397.

Title, "*Improvement of Birefringent Filters, 2: Achromatic Wave Plates*," Applied Optics, vol. 14, No. 1, Jan. 1975, pp. 229–237.

McIntyre et al., "*Achromatic Wave Plates for the Visible Spectrum*," Journal of the Optical Society of America, vol. 58, No. 12, Dec. 1968, pp. 1575–1580.

Simmons, "*Phase Shift by Periodic Loading of Waveguide and its Application to Broad–band Circular Polarization*, "IRE Transactions—Microwave Theory and Techniques, Dec. 1955, pp. 18–21.

Murray et al., "*Development of Achromatic Wave Plates for Submillimeter Polarimetry*," Polarimetry of the Interstellar Medium ASP Conference Series, 1996, pp. 116–117.

Glenn et al., "*Cyclops: A Single Beam 1.3 Millimeter Polarimeter*," International Journal of Infrared and Millimeter Waves, vol. 18, No. 2, 1997, pp. 285, 294–300.

Trapani, "*Polarizers and Applications*," Proceedings of SPIE—The International Society for Optical Engineering, vol. 307, 1981, pp. i–vi, 13–21, 25–30, 83–88, 90–97, 106–111, 120–125.

Kitsuregawa, "*Advanced Technology in Satellite Communication Antennas: Electrical & Mechanical Design*," Artech House, 1990, pp. i–ix, 80–91.

Yates et al., "*Polarization Diversity Lowers Antenna Feed—Line Noise*," Microwaves, May 1968, pp. 60–65.

Destriau et al., "*Réalisation d'un Quart d'Onde Quasi Achromatique par Juxtaposition de Deux Lames Cristallines de Même Nature*," Le Journal de Physique et le Radium, Series 8, vol. 10, Feb. 1949, pp. 53–55.

Chang, "*Analyse des Septumpolarisators mit Hilfe der Orthogonalentwicklung*," Frequenz, vol. 39, 1985, pp. 18–21.

* cited by examiner

BROADBAND HIGH PRECISION CIRCULAR POLARIZERS AND RETARDERS IN WAVEGUIDES

CROSS REFERENCE TO RELATED APPLICATIONS

This application claims the benefit of Provisional Application No. 60/357,597 having the title "Broadband High Precision Circular Polarizers and Retarders in Waveguides" filed on Feb. 15, 2002, the entirety of which is herein incorporated by reference.

FEDERALLY SPONSORED RESEARCH OR DEVELOPMENT

The subject matter of this application was funded in part by the National Science Foundation (Grant No. NSF-OPP-8920223). The United States government may have certain rights in this invention.

FIELD OF THE INVENTION

This invention relates to the propagation of radiation in waveguides. More particularly, the invention relates to compound retarders and circular polarizers in waveguides.

BACKGROUND

Microwave and millimeter-wave technology has application in a variety of areas, such as in satellite or terrestrial communication, radar, and astronomy. Many of these applications use polarized radiation in their operation. The polarization may be circular or linear, and some systems use both types of polarization or convert from one type to the other. Other systems may require that the radiation is converted between linear, left-circular, and right-circular polarizations or that the phase or polarization state of the radiation is varied continuously. The conversion typically takes place within a waveguide, and the components that perform the conversions are generally termed "phase shifters," "circular polarizers," "phase retarders," or simply "retarders" in the art.

An example of a conversion in practice is the rotation of the orientation of linearly polarized microwave radiation in satellite communications. Some satellite microwave antennae are linearly polarized. Moving the satellite to a different orbit or communicating with a different ground station may require that the orientation of linear polarization be changed. One method of accomplishing the reorientation is by converting the linearly polarized radiation to circularly polarized radiation, and then converting the resulting circularly polarized radiation back into linearly polarized radiation but with the changed orientation. Such a change may be accomplished by one or more retarders within the waveguide that feed the antenna of the satellite or the antenna of the ground station.

Alternatively, some communication antennae are circularly polarized, and the communication does not require matching of the orientation of the transmitter and the receiver. Such systems, however, may include a linearly polarized transmitter or receiver. Coupling a circularly polarized antenna to the transmitter or receiver may be accomplished by one or more retarders within the waveguide that connects the antenna to the transmitter or receiver.

A retarder has two orthogonal principal axes. Radiation that is linearly polarized along one principal axis receives a phase shift with respect to radiation that is linearly polarized along the other principal axis. As is known in the art, converting linearly polarized radiation to circularly polarized radiation may be accomplished by a retarder whose principal axes are oriented at 45° to the linearly polarized radiation and which imposes a phase shift of 90° with respect to the orthogonal polarization states. This configuration of the retarder is called a quarter wave retarder or a circular polarizer. In general, by selecting different orientations with respect to incident radiation and by designing the retarders to impose different phase shifts, components with a variety of properties are possible.

It is generally desired that retarders operate efficiently and precisely over a broad range of frequencies. As is known in the art, there are many convenient parameters that may be used to measure the efficiency or precision of the retarder. For example, a retarder configured as a circular polarizer may efficiently convert linearly polarized radiation to circularly polarized radiation within its bandwidth, but produce polarized radiation that is unacceptably elliptical at frequencies that lie outside the bandwidth. One measure of the efficiency of a circular polarizer is known as the axial ratio in the art. In the case of a right-handed circular polarizer, inefficient operation results in a leakage of radiation that is left-handed polarized. The leakage of the right-handed circular polarizer may be defined as the complex voltage amplitude, $D_R$, of the left-handed circular response of the polarizer. In the case where linearly polarized radiation is received by the retarder, $D_R$ is the voltage corresponding to the components of the electric field of the left-handed polarized radiation that is transmitted by the polarizer. The axial ratio, A, may then be defined by equation Eq. 1:

$$A = 20\log_{10}\left[\frac{\sqrt{1-|D_R|^2}+|D_R|}{\sqrt{1-|D_R|^2}-|D_R|}\right] \quad \text{(Eq. 1)}$$

An axial ratio of zero decibels ("dB") corresponds to a perfect polarizer with no leakage into the orthogonal polarization state. The frequency range over which the axial ratio is below a certain level, divided by the center frequency, can be used to define the bandwidth of the polarizer. The bandwidth may also be expressed as a percentage, by dividing the frequency range by the center frequency.

Methods for constructing waveguide retarders include incorporating corrugations or ridges on the inside walls of the waveguide, or introducing dielectric slabs within the waveguide. Variations on these structures have been constructed in an attempt to achieve a large bandwidth.

One example of a waveguide retarder is disclosed in Lier, E. and Schaugg-Pettersen, T., A Novel Type of Waveguide Polarizer with Large Cross-Polar Bandwidth. IEEE Transactions in Microwave Theory and Techniques, vol. 37, no. 11, pp. 1531–1534 (1988). The paper discloses a single element circular polarizer constructed by incorporating transverse corrugations into the walls of the rectangular waveguide. In this configuration, an axial ratio of less than 0.11 dB is achieved over a bandwidth of approximately 28%.

Another example of a waveguide retarder is disclosed in Uher, J., Bornemann, J., and Rosenberg, U., Waveguide Components for Antenna Feed Systems: Theory and CAD, pp. 419–433, Boston, Artech House, 1993. The book discloses single element circular polarizers including those constructed by tapering the waveguide, incorporating corrugations into the walls of the waveguide, and introducing dielectric slabs into the waveguide. In these configurations, bandwidths of up to approximately 40% with an axial ratio less than 0.37 dB may be achieved.

A further example of a waveguide retarder is disclosed in the U.S. Pat. No. 6,097,264 to Vezmar. The patent discloses a single element circular polarizer incorporating four axial ridges into the walls of the waveguide. In these configurations, bandwidths of up to approximately 60% may be achieved, but with relatively high leakage indicated by an axial ratio of less than 1.7 dB.

For many applications, however, larger bandwidths or lower leakages are desired. Therefore there is a need for a retarder or polarizer that has little leakage over a broad bandwidth.

SUMMARY

Apparatus and methods are described below to address the need for a polarizer or retarder that operates in a waveguide. In accordance with one aspect of the invention, a compound retarder is provided. The compound retarder includes n consecutive single element retarders. n represents an integer number greater than one. Each single element retarder imposes a respective aligned retardation phase and has a respective aligned orientation angle with respect to an input orientation of the waveguide. Behavior of the compound retarder is parametrized by frequency dependent resultant parameters. The aligned orientation angle and aligned retardation phase for each single element retarder are selected to render at least one of the resultant parameters invariant to a higher order in variation of frequency about a selected frequency than at least one of the single element retarders.

Another aspect of the invention is a method of aligning n consecutive single element retarders in a waveguide with respect to an input orientation of the waveguide to form a compound retarder. n represents an integer number greater than one. The method includes parametrizing behavior of the compound retarder to obtain frequency dependent resultant parameters. The method also includes computing variations of a first selection of the resultant parameters with respect to frequency to at least first order about a selected frequency. The method further includes constraining a second selection of the resultant parameters at the selected frequency to characteristic values for the compound retarder to obtain k first constraint equations. k represents an integer number greater than zero. The method yet further includes constraining m of the variations of the resultant parameters with respect to the frequency to obtain m second constraint equations. m represents an integer number greater than zero, and (m+k) is at least 2n. The method further includes solving the first and second constraint equations to obtain n pairs of aligned retardation phases and aligned orientation angles, one pair for each of the single element retarders. The method yet further includes positioning each single retarder element in the waveguide to impose its respective aligned retardation phase at its respective aligned orientation angle with respect to the input orientation.

A further aspect of the invention is a computer readable medium. The computer readable medium stores instructions for causing a processor to execute steps. The steps include computing variations of a first selection of resultant parameters with respect to frequency to at least first order about a selected frequency. Behavior of the compound retarder is parameterized by the resultant parameters. The steps also include constraining a second selection of the resultant parameters at the selected frequency to characteristic values for the compound retarder to obtain k first constraint equations. k represents an integer number greater than zero. The steps further include constraining m of the variations of the first selection of the resultant parameters with respect to the frequency to obtain m second constraint equations. m represents an integer number greater than zero, and (m+k) is at least 2n. The steps yet further include solving the first and second constraint equations to obtain n pairs of aligned retardation phases and aligned orientation angles, one pair for each of the single element retarders.

The foregoing and other features and advantages of preferred embodiments will be more readily apparent from the following detailed description, which proceeds with reference to the accompanying drawings.

DETAILED DESCRIPTION OF THE PRESENTLY PREFERRED EMBODIMENTS

The retarders disclosed in the aforementioned prior art are dual polarization waveguides that include some structure. The structure imposes a phase difference between radiation whose electric field is parallel or perpendicular to the structure. The structure imposes only a single phase difference on radiation that travels through the retarder in one step. As such, these retarders are termed single element, or simple, retarders.

Figure 1:
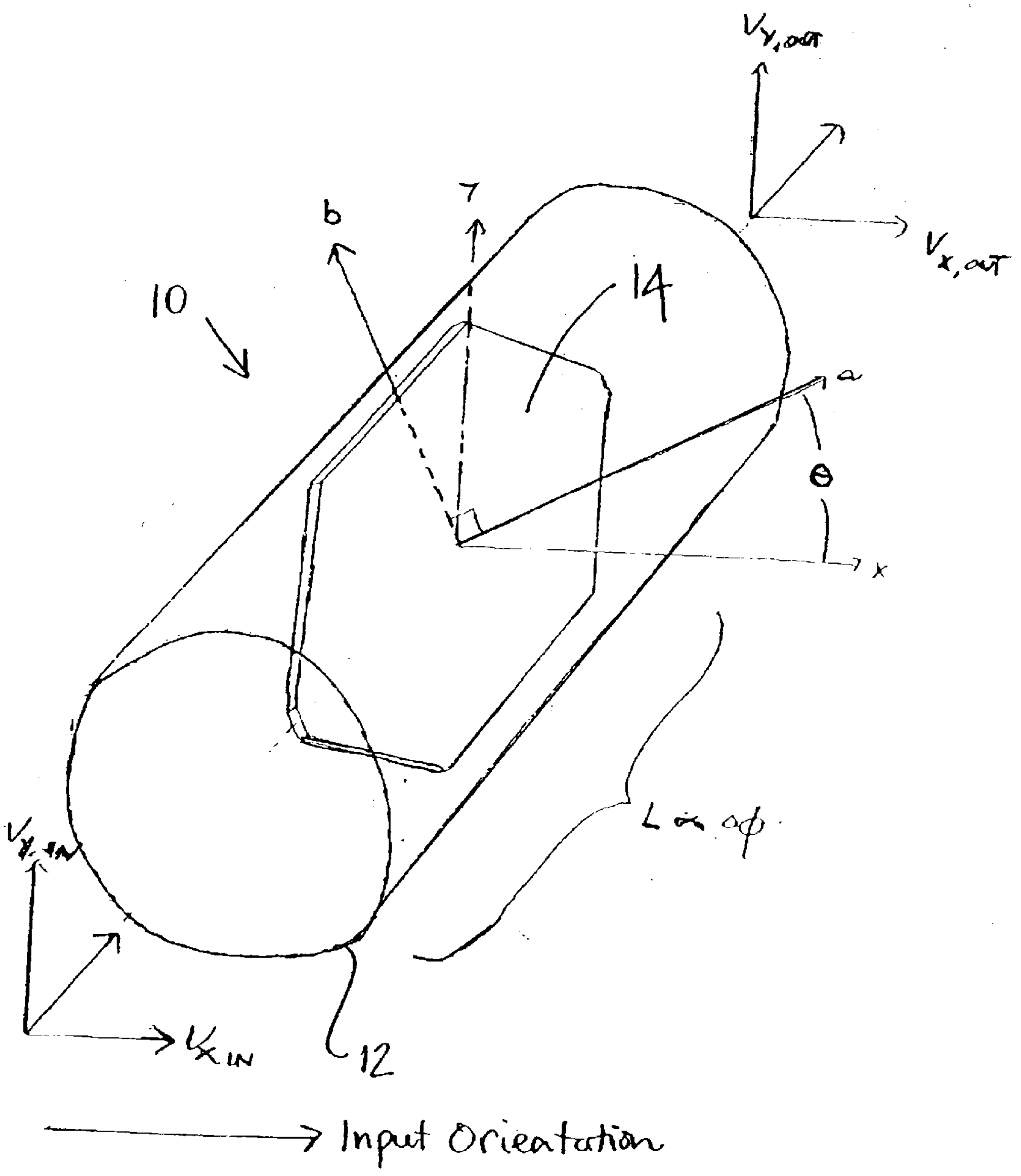
FIG. 1 is a diagram illustrating an exemplary single element retarder.

FIG. 1 is a diagram illustrating an exemplary single element retarder 10. The retarder 10 comprises a waveguide 12 that houses a structure 14 for imposing the phase difference. The waveguide 12 typically has a circular or square cross section as shown in FIG. 1. It should be understood, however, that other cross sections of the waveguide 12 are possible, such as a rectangular or elliptical cross section. The structure 14 shown in FIG. 1 is a dielectric slab of length L that imposes a phase difference $\Delta\phi$ between radiation whose electric field is parallel to the principal axis a and radiation whose electric field is parallel to the other principal axis b. It should also be understood, however, that the structure 14 is not limited to a dielectric, and that other structures 14, such as ridges or corrugations, may be introduced into the waveguide 12 to impose the phase difference.

The two signal components at the input of the retarder 10 are denoted $V_{x,in}$ and $V_{y,in}$. The two signal components at the output of the retarder 10 are similarly denoted $V_{x,out}$ and $V_{y,out}$. The x-axis is defined by the input orientation of the waveguide 12. The input orientation is a convenient reference axis for the retarder 10 with respect to which all orientation angles and voltage components are measured. For example, if the retarder 10 is designed to receive linearly polarized radiation at the input, the input orientation may be chosen to coincide with the plane of polarization of the radiation.

The action of a retarder 10 is to delay the propagation of the signal component along principal axis b with respect to the propagation of the signal component along principal axis a. The structure 14 shown in FIG. 1, for example, is aligned with the principal axes a and b of the retarder 10 and cause the electrical properties of the waveguide 12 about these axes to differ. As a result, signals with electrical fields oriented along either of these principal axes will propagate at different speeds, producing a total relative phase shift $\Delta\phi$, the retardation phase. The retardation phase may be tuned by controlling the overall physical length of the retarder 10 or structure 14, or by controlling the difference in the electrical properties of the structure 14 that determine the two propagation speeds.

As an example, for a single element retarder, the x- and y-axes may be chosen to align with the principal axes a and b of the retarder 10. The action of this retarder 10 may be described by equation Eq. 2:

$$V_{x,out}=e^{-i\phi_a}V_{x,in}$$

$$V_{y,out}=e^{-i(\phi_a+\Delta\phi)}V_{y,in} \quad \text{(Eq. 2)}$$

if the insertion loss of the retarder 10 is negligible. Both signal components receive a common phase shift $\phi_a$, but the phase shift of the $V_y$ component $\phi_b=\phi_a+\Delta\phi$ receives an additional retardation phase $\Delta\phi$ compared to the $V_x$ component.

In general, however, as depicted in FIG. 1, the retarder is rotated such that its principal axes are not aligned with the x- and y-axes, but are offset at an orientation angle $\theta$. In this case, the action of the single element retarder on an input signal is described by the matrix equation Eq. 3:

$$\begin{bmatrix} V_{x,out} \\ V_{y,out} \end{bmatrix} = \begin{bmatrix} \cos\theta & \sin\theta \\ -\sin\theta & \cos\theta \end{bmatrix} \begin{bmatrix} e^{-i\phi_a} & 0 \\ 0 & e^{-i(\phi_a+\Delta\phi)} \end{bmatrix} \begin{bmatrix} \cos\theta & -\sin\theta \\ \sin\theta & \cos\theta \end{bmatrix} \begin{bmatrix} V_{x,in} \\ V_{x,in} \end{bmatrix} \quad \text{(Eq. 3)}$$

In typical applications, the common phase shift $\phi_a$ may be neglected. In this case, the matrix that represents the action of the retarder 10 depends only on the retardation phase $\Delta\phi$ and the orientation angle $\theta$ of the retarder 10 with respect to the incoming signal components.

One embodiment of the retarder 10, known as a quarter-wave retarder 10, is configured to impose a retardation phase of $\Delta\theta=90°$. For example, a circular polarizer is a quarter-wave retarder set at an orientation angle of $\theta=45°$. If at the input we excite only $V_{x,in}$ (with $V_{y,in}=0$), corresponding to a pure linearly polarized input signal, then the output signals $V_{x,out}$ and $V_{y,out}$ (will have equal amplitude but with a −90° relative phase shift, corresponding to pure right-handed circular polarization. The handedness for circularly polarized radiation follows the convention defined in IEEE, Standard Definitions of Terms for Radio Wave Propagation, Std. 211-1977, Institute of Electrical and Electronics Engineers, Inc., New York, 1977. Similarly, if the orientation angle of the retarder is changed to $\theta=-45°$, then the orthogonal (left-handed) circular polarization is produced, and if the orientation angle is $\theta=0°$ then linear polarization is transmitted.

Another embodiment of the retarder 10, known as a half-wave retarder 10, is configured to impose a retardation phase $\Delta\phi=180°$. For example, a half-wave retarder 10 with a variable orientation angle $\theta$ may be used as a polarization rotator. For this device, the matrix equation Eq. 3 takes the form of Eq. 4:

$$\begin{bmatrix} V_{x,out} \\ V_{y,out} \end{bmatrix} = \begin{bmatrix} \cos2\theta & -\sin2\theta \\ -\sin2\theta & -\cos2\theta \end{bmatrix} \begin{bmatrix} V_{x,in} \\ V_{x,in} \end{bmatrix} \quad \text{(Eq. 4)}$$

If at the input we excite only $V_{x,in}$ (with $V_{y,in}=0$), corresponding to a pure linearly polarized input signal, then the output signals will also be linearly polarized but with the electric field orientation rotated by an angle $-2\theta$.

Retarder Frequency Response

A retarder 10, such as the simple retarder depicted in FIG. 1, may be configured to impose a desired retardation phase $\Delta\phi_0$ at a selected frequency $\nu_0$. If the two propagation speeds with respect to the structure 14 are independent of the frequency of the signals, the retardation phase is substantially proportional to frequency according to Eq. 5:

$$\Delta\phi(\nu)\propto\nu \quad \text{(Eq. 5)}$$

At frequencies higher than $\nu_0$, the retardation phase is greater than $\Delta\phi_0$, and at frequencies lower than $\nu_0$, the retardation phase is lower than $\Delta\phi_0$.

The propagation speed and corresponding total phase delay $\phi_a(\nu)$ for a mode in a typical waveguide 12, however, depends not only on frequency but also on the cross-sectional geometry and other structures 14 in the waveguide. The functional dependence of the total phase $\phi_a(\nu)$ on frequency becomes increasingly complex and depends on the details of that cross-sectional geometry and/or those structures 14. The prior art references mentioned above are specific embodiments of cross-sectional geometry and/or structures 14 that are introduced into the waveguide 12 to achieve a retardation phase $\Delta\phi(\nu)=\phi_b(\nu)-\phi_a(\nu)$ that is less dependent on the frequency as compared to the frequency response of Eq. 5.

The dependence of the retardation phase on the frequency manifests itself as a leakage of the signal input to the retarder 10 into an orthogonal polarization state. For example, in the circular polarizer described above, the retardation phase $\Delta\phi=90°$ may only be accurate over a limited frequency range. Outside the frequency range, the retardation phase deviates from 90° and the polarizer no longer outputs purely a right-handed circularly polarized signal. Instead, the polarizer will also output some left-handed circularly polarized radiation. Consequently, by the definition of Eq. 1, the axial ratio for the polarizer will deviate from zero decibels outside the frequency range.

The usable bandwidth of a waveguide retarder 10, or of any device (like a circular polarizer) that is based on retarders, is limited to the range of frequencies over which the error in the retardation phase is less than some a specified tolerance as shown in Eq. 6:

$$|\Delta\phi(\nu)-\Delta\phi_0|<\delta\phi_{tol} \quad \text{(Eq. 6)}$$

In order to operate over a high-bandwidth, the cross-sectional geometry and/or structures within the waveguide are selected so as to provide the desired retardation phase at the selected frequency and to flatten $\Delta\phi(\nu)$ as much as possible over the desired band of operation. The single element retarders 10 disclosed in the prior art flatten the frequency response by configuring the waveguide 12 and structure 14 such that the first or second derivative of the retardation phase with respect to frequency vanishes.

It is therefore desirable to construct a retarder for use in a waveguide 12 that controls the value of $\Delta\phi_0$ and the flatness of the functional dependence of the retardation phase on frequency $\Delta\phi(\nu)$. It is also desirable that any such waveguide retarders have transition sections that are matched to produce a return loss suitable to the application. Such waveguide retarders preferably also have low ohmic and dielectric losses in the waveguide 12 walls and control structures 14, and preferably also suppress the excitation of unwanted higher-order modes. Additional considerations are that the waveguide retarders are inexpensive and produced with a consistent quality by the manufacturing process.

Compound Retarders

In order to solve the problems in the prior art, a waveguide retarder may be constructed that is composed of more than one element. As described below, this compound retarder may be configured to have a larger bandwidth than the prior art single element retarders by appropriately selecting the orientation angle and retardation phase of each element. The orientation angles and retardation phases may be chosen to cancel the higher order frequency components of the overall retardation phase of the compound retarder. The frequency response of the individual single element retarders cooperate to provide the frequency invariant retardation phase over the larger bandwidth.

Figure 2:
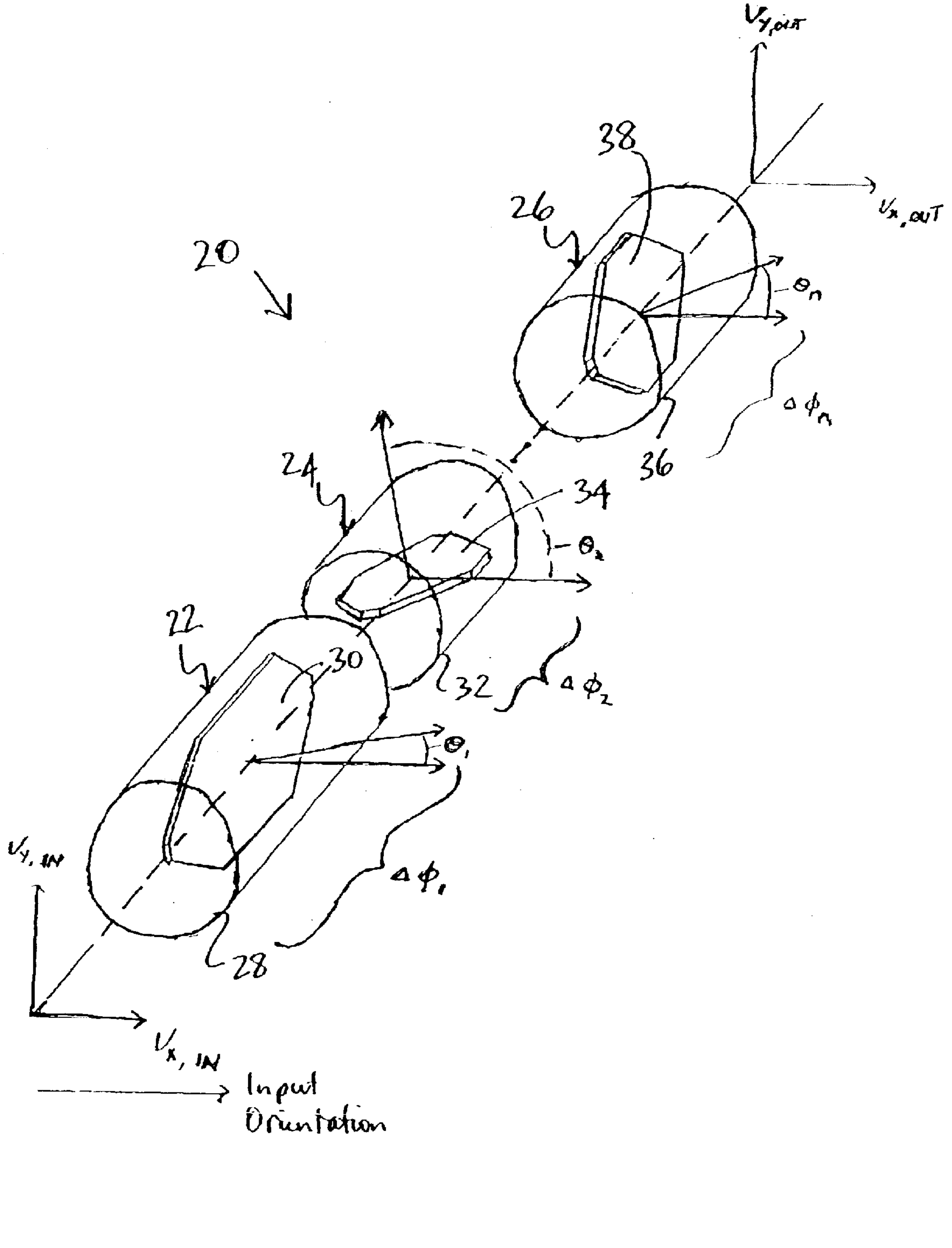
FIG. 2 is a diagram illustrating a configuration of a compound waveguide retarder comprising multiple single element retarders of FIG. 1.

FIG. 2 is a diagram illustrating a configuration of a compound waveguide retarder 20 comprising multiple single element retarders 10 of FIG. 1. The compound retarder 20 includes one or more single element retarders 22, 24, 26. The first retarder 22 imposes a retardation phase $\Delta\phi_1$ over the length of the first waveguide 28. The first structure 30 has an orientation angle of $\theta_1$ with respect to the input orientation. The second retarder 24 imposes a retardation phase $\Delta\phi_2$ over the length of the second waveguide 32 and has an orientation angle of $\theta_2$ for the second structure 34. Similarly for all single element retarders 22, 24, 26 of the compound retarder 20. The final single element retarder 26, which provides the output signal of the compound retarder 20, imposes a retardation phase $\Delta\phi_n$ over the length of the final waveguide 36 and has an orientation angle of $\theta_n$ for the final structure 38. In a preferred embodiment, the single element retarders 10 are not separated from one another by gaps or spacers, and the first 28, second 32, etc., and final 36 waveguides are integrated into a single continuous waveguide containing the aligned structures 30, 34, 38. The input orientation for the compound retarder 20 is chosen to correspond to that of an equivalent single element retarder 10. For example, if the compound retarder 20 is a quarter-wave retarder the input orientation may be chosen such that received radiation that is linearly polarized along the input orientation is transmitted as right-handed circularly polarized radiation.

The action of an ideal single element retarder 10 on an input signal may be represented by a matrix equation Eq. 7:

$$\begin{bmatrix} V_{x,out} \\ V_{y,out} \end{bmatrix} = S(\Delta\phi, \theta) \begin{bmatrix} V_{x,in} \\ V_{x,in} \end{bmatrix} \quad \text{(Eq. 7)}$$

similar to Eq. 3 above. The matrix S $(\Delta\phi,\theta)$ represents the relationship between the input signal and the output signal for a single element retarder 10 that imposes a retardation phase $\Delta\phi$ and is at an orientation angle $\theta$. The matrix S $(\Delta\phi,\theta)$ may be written in the general form of Eq. 8:

$$S(\Delta\phi, \theta) = \begin{bmatrix} \cos\theta & \sin\theta \\ -\sin\theta & \cos\theta \end{bmatrix} \begin{bmatrix} e^{\frac{i\Delta\phi}{2}} & 0 \\ 0 & e^{\frac{-i\Delta\phi}{2}} \end{bmatrix} \begin{bmatrix} \cos\theta & -\sin\theta \\ \sin\theta & \cos\theta \end{bmatrix} \quad \text{(Eq. 8)}$$

In general, the action of a compound retarder 20 composed of n single element retarders is a compounding of Eq. 7, which may be written as in Eq. 9:

$$\begin{bmatrix} V_{x,out} \\ V_{y,out} \end{bmatrix} = S(\Delta\phi_n, \theta_n) \ldots S(\Delta\phi_2, \theta_2)S(\Delta\phi_1, \theta_1) \begin{bmatrix} V_{x,in} \\ V_{x,in} \end{bmatrix} \quad \text{(Eq. 9)}$$

This may also be expressed as a single 2×2 complex matrix $S_{compound}$, which is the product of the n matrices for the single element retarders 10.

In an ideal compound retarder having no reflection of radiation at the input and output ports, and having no internal losses, the compound matrix is unitary and may be written in the form of Eq. 10:

$$S_{compound} = \begin{bmatrix} S_1 & S_2 \\ -S_2^* & S_1^* \end{bmatrix} \quad \text{(Eq. 10)}$$

where $|S_1|^2+|S_2|^2=1$. The dependence of the components of the matrix, $S_1$ and $S_2$, on the orientation angles and retardation angles of the individual single element retarders 10 may be derived from the matrix product Eq. 9.

As $S_{compound}$ is a 2×2 unitary matrix, there are only 3 independent parameters that determine the matrix components and define the action of the compound retarder 20. In one preferred embodiment, the resulting parameters are chosen to be the phase of $S_1$, $\alpha=\arg(S_1)$, the phase of $S_2$, $\beta=\arg(S_2)$, and the ratio of their amplitudes, $r=|S_1|/|S_2|$. For example, a right-handed circular polarizer that is constructed as a compound retarder 20 has resulting parameters $\beta-\alpha=-90°$, and r=1. It should be understood, however, that other choices for parameterizing the components of the matrix are possible and the present invention is not limited to the above parameterization of the matrix.

Frequency Variation of the Resulting Parameters

Each resulting parameter varies with frequency due to the individual frequency responses of the single element retarders 10 that comprise the compound retarder 20. At frequency ν, each individual element introduces a retardation phase $\Delta\phi_i(\nu)$ along that element's principal axes. The compound frequency response will also depend on the orientations of the individual single element retarders 10. For example, the dependence on frequency of the resulting parameter α may be described as in Eq. 11:

$$\alpha=\alpha(\Delta\phi_1(\nu) \ldots \Delta\phi_n(\nu),\theta_1 \ldots \theta_n) \quad \text{(Eq. 11)}$$

With the constraint on this resulting parameter dictated by the desired properties of the compound retarder 20, Eq. 11 and similar equations for the other resultant parameters may be simultaneously solved to obtain the retardation phases and orientations for the individual single element retarders 10 that comprise the compound retarder 20.

Although each of the retardation phases varies with frequency, at particular values of the orientation angles for each single element retarders 10 the net effect is that the frequency variations collectively cancel each other over the whole compound retarder 20. Alternatively, the net effect is that the frequency variations collectively minimize the dependence of the compound retarder 20 on frequency. Consequently, a compound retarder 20 thus aligned is expected to have a large bandwidth.

But when the single element retarders 10 are not aligned with these particular orientation angles, the frequency variation of the single element retarders 10 do not cancel along the length of the compound retarder 20. In this case, the compound retarder 20 displays a dependency on frequency and deviates from its designed behavior outside a narrow range of frequencies. Such an unaligned compound retarder 20 has a narrow bandwidth.

At the selected frequency $\nu_0$, each single element retarder 10 of the compound retarder 20 imposes a retardation phase $\Delta\phi_{0i}=\Delta\phi_i(\nu_0)$. The variation of the retardation phase with respect to frequency $\Delta\phi_i(\nu)$ about the selected frequency may be found empirically or from knowledge of the design of each single element retarder 10. The frequency dependence of the resultant parameters, for example Eq. 11, may be expressed as a power series in variations of the resultant parameters with respect to frequency about the selected frequency as in Eq. 12:

$$\alpha(\nu)=\alpha(\nu_0)+\sum_{m=1}\alpha_m\frac{(\nu-\nu_0)^m}{m!} \quad \text{(Eq. 12)}$$

where the $\alpha_m$, is the variation to order m with respect to frequency about the selected frequency. As is known to those of skill in the art, $\alpha_m$ is the m-th order derivative of the resultant parameter with respect to frequency, evaluated at the specific frequency as in Eq. 13:

$$\alpha_m=\left.\frac{d^m\alpha(\nu)}{d\nu^m}\right|_{\nu=\nu_0} \quad \text{(Eq. 13)}$$

The resulting parameters retain their values over a wider frequency range if higher order variations of the resulting parameters with respect to frequency vanish.

For single element retarders 10 of similar construction, the fractional variation $\delta(\nu)$ of the retardation phase with frequency is the same for each element 10 as in Eq. 14:

$$\Delta\phi_i(\nu)=[1+\delta(\nu)]\Delta\phi_{0i} \quad \text{(Eq. 14)}$$

In this manner, the variation in frequency of the resulting parameter of Eq. 11 may be re-expressed in terms of the frequency dependence on the fractional variation as in Eq. 15:

$$\alpha=\alpha(\delta(\nu);\Delta\phi_{01}\ldots\Delta\phi_{0n},\theta_1\ldots\theta_n) \quad \text{(Eq. 15)}$$

At the selected frequency, the fractional variation vanishes, $\delta(\nu_0)$ 0, and the resulting parameters take their characteristic values for the desired properties of the compound retarder 20, i.e., $\alpha=\alpha_0$, $\beta=\beta_0$ and $r=r_0$ for the above parameterization.

The resulting parameters are less sensitive to the variations in frequency of the retardation phases $\Delta\phi_i$ ($\nu$) if they are also insensitive to changes in the fractional variation $\delta(\nu)$. Considering Eq. 15 as a series expansion in the fractional variation about $\delta=0$, the resulting parameters retain their values over a wider frequency range if higher order variations of the resulting parameters with respect to the fractional variation vanish. Therefore broader bandwidth of the compound retarder 20 is achieved as one or more of the higher derivatives of the resulting parameters vanish as exemplified in Eq. 16:

$$\frac{\partial\alpha}{\partial\delta}(\delta=0)=0;\ \frac{\partial^2\alpha}{\partial\delta^2}(\delta=0)=0;\ \frac{\partial\beta}{\partial\delta}(\delta=0)=0;\ \text{etc.} \quad \text{(Eq. 16)}$$

In the case of certain compound retarders 20, such as circular polarizers, it may be sufficient to constrain two of the three resultant parameters. In this case, in addition to constraining the two resultant parameters to take their characteristic values, the 2n conditions on these resultant parameters may include constraints that the resultant parameters are also invariant to variation in $\delta$ to order n−1, i.e., the first n−1 derivatives with respect to $\delta$ of the resultant parameters vanish at the selected frequency ($\delta=0$).

Alternatively, in the case of certain compound retarders 20, such as quarter-wave retarders, all three parameters may be constrained. For example, a three-element compound quarter-wave retarder 20 has all three resultant parameters constrained to take their characteristic values. In this case, the six conditions on these resultant parameters may include three remaining constraints that the first order variation with respect to $\delta$ vanishes at the selected frequency for each of the three resultant parameters. In general, designing an n-element compound retarder 20 for which 2n is not a multiple of three may include selecting which resultant parameters are constrained to a higher order in $\delta$ than the other resultant parameters.

For a compound retarder 20 comprising n single element retarders 10, there are n retardation phases $\Delta\phi_{0i}$ and n orientation angles $\theta_i$ to be determined for a total of 2n angles. The conditions on the resultant parameters and higher derivatives at the selected frequency, such as in Eq. 16, provide a series of 2n equations as shown in Eq. 17:

$$2n\ \text{equations}\begin{cases}\alpha_0=\alpha(\delta(\nu_0), & \overbrace{\Delta\phi_{01},\Delta\phi_{02},\ldots,\Delta\phi_{0n},\theta_1,\theta_2,\ldots,\theta_n}^{2n\ \text{variables}})\\ 0=\alpha'(\delta(\nu_0), & \Delta\phi_{01},\Delta\phi_{02},\ldots,\Delta\phi_{0n},\theta_1,\theta_2,\ldots,\theta_n)\\ 0=\alpha''(\delta(\nu_0), & \Delta\phi_{01},\Delta\phi_{02},\ldots,\Delta\phi_{0n},\theta_1,\theta_2,\ldots,\theta_n)\\ \ldots & \ldots\\ \beta_0=\beta(\delta(\nu_0), & \Delta\phi_{01},\Delta\phi_{02},\ldots,\Delta\phi_{0n},\theta_1,\theta_2,\ldots,\theta_n)\\ 0=\beta'(\delta(\nu_0), & \Delta\phi_{01},\Delta\phi_{02},\ldots,\Delta\phi_{0n},\theta_1,\theta_2,\ldots,\theta_n)\\ \ldots & \ldots\\ r_0=r(\delta(\nu_0), & \Delta\phi_{01},\Delta\phi_{02},\ldots,\Delta\phi_{0n},\theta_1,\theta_2,\ldots,\theta_n)\\ 0=r'(\delta(\nu_0), & \Delta\phi_{01},\Delta\phi_{02},\ldots,\Delta\phi_{0n},\theta_1,\theta_2,\ldots,\theta_n)\\ \ldots & \ldots\end{cases} \quad \text{(Eq. 17)}$$

where a prime denotes a partial derivative with respect to $\delta$. These equations may be simultaneously solved for the angles ($\Delta\phi_{01}$, $\Delta\phi_{02}$, . . . ,$\Delta\phi_{0n}$, $\theta_1$,$\theta_2$, . . . ,$\theta_n$) which cause the resultant parameters $\alpha$, $\beta$, and r to take their required values, and also to render the resultant parameters invariant to variations in $\delta$ to some specified order.

The functional dependence of the resultant parameters on the angles may be obtained from the matrix equation Eq. 9. The functional dependence of the resulting parameters on the fractional variation may be obtained by substituting the expression of Eq. 14 for the retardation phases. In a preferred embodiment, the derivation of the simultaneous equations is performed analytically, by explicit differentiation of the functional dependence of the resultant parameters on the fractional variation. As is known to those of ordinary skill in the art, such an analytical derivation may be performed explicitly or performed by a computer running a symbolic manipulation program, such as the Mathematica computer program from Wolfram Research, Inc. of Champaign, Ill., and the Maple computer program from Waterloo Maple, Inc. of Waterloo, Ontario.

The resulting simultaneous equations, Eq. 17, may also be solved analytically using such computer programs or may be solved numerically by methods known to those in the art In another preferred embodiment, the solution of the simultaneous equations, Eq. 17, may be found using numerical techniques known to those in the art, such as a numerical grid search method, without explicitly deriving the analytic dependence of the resultant parameters on the angles or the fractional variation.

Both the numerical solution and symbolic manipulation may be performed on a general purpose computing device or processor. The computing device or processor accepts instructions, in the form of data bits, that are executed to perform the specific tasks described above. The data bits may be maintained on a computer readable medium including magnetic disks, optical disks, and any other volatile or non-volatile mass storage system readable by the computer. The computer readable medium includes cooperating or interconnected computer readable media that exist exclusively on the computer or are distributed among multiple interconnected processing systems that may be local to or remote to the computer. For example, the instructions may be stored on a floppy disc or CD-ROM familiar to those skilled in the art. The instructions on the disc or CD-ROM may comprise a self-contained set of instructions that program the general purpose computer, or may comprise a limited set of instructions that operate in combination with a more general program running on the general purpose computer.

If the single retarder elements 10 in the compound retarder 20 have retardation phases that vary to first-order with respect to frequency, then the fractional variation is proportional to ($\nu-\nu_0$). In this case, resultant parameters that are invariant to some order in $\delta$ are also invariant to the same order in frequency.

An additional advantage, however, may be obtained by using single retarder elements 10 which have retardation phases $\Delta\phi_i(\nu)$ that are at least first-order frequency invariant. In this case, rendering the resultant parameters invariant to variations in $\delta$ to some specified order results also makes them frequency invariant to a higher order in $\nu$ than the specified order in $\delta$. In this manner, the compound retarder 20 whose retardation phases and orientation angles solve Eq. 17 maintains its properties over a larger frequency range. For example, as described below, at the central frequency $\nu_0$ the single element retarders 10 may be designed to have retardation phases $\Delta\phi_i$ ($\nu$) that are first-order frequency invariant. Alternative designs for first-order frequency invariance are found in the prior art references cited above. Consequently, the fractional variation quadratically depends on frequency as in Eq. 18:

$$\delta(\nu)\propto(\nu-\nu_0)^2 \quad \text{(Eq. 18)}$$

If one of the simultaneous equations in Eq. 17 has a vanishing partial derivative with respect to $\delta$, e.g. $\alpha'=0$, but there is no constraint on the second derivative, the leading order variation of the resulting parameter is quadratically dependent on $\delta$. From the frequency dependence of Eq. 16, the leading dependence of the resulting parameter on frequency is therefore quartic as in Eq. 17:

$$\alpha(\nu)-\alpha_0\propto(\nu-\nu_0)^4 \quad \text{(Eq. 19)}$$

The compound retarder 20 is therefore frequency independent to third order if its single element retarder components 10 are frequency invariant to first order. If we also constrain the second order variation with respect to the fractional variation, i.e., the second derivative $\alpha''=0$, the compound retarder 20 may be made frequency invariant to fifth order.

In another embodiment, the single retarder elements 10 may differ in their construction so that the fractional variation of the retardation phase with frequency $\delta$ of each element is not the same. In this case, the values of the parameters and their derivatives with respect to $\nu$, rather than $\delta$ may be directly constrained in the simultaneous equations Eq. 17. The equations may be solved for the orientation angles and retardation phases that cause the resultant parameters to take their required values, and also to render the resultant parameters invariant to variations in $\nu$ to some specified order. In this case, however, the solutions may depend in detail on the differences in fractional variation of each element.

It should be appreciated by one of ordinary skill in the art that the above constraints Eq. 17 are for illustration only and that the invention is not restricted to solving the constraints at a single selected fractional variation $\delta(\nu_0)$, or a single selected frequency $\nu_0$. The solutions at a single selected frequency are termed "maximally flat" because they achieve the highest possible precision (such as axial ratio) near the selected (central) frequency.

In another preferred embodiment, Eq. 17 may include constraining a particular resultant parameter to its respective characteristic value at more than one value of $\delta$ if the constraints are expressed in terms of the fractional variation. Alternatively, the particular resultant parameter may be constrained to its respective characteristic value at more than one value of $\nu$ if the constraints are expressed in terms of the frequency. Such constraints at multiple frequencies of frequency variations may substitute for constraints on the higher order variations of the resultant parameters with respect to frequency or fractional variation as described above. For example, as an alternative to constraining $\alpha(\delta(\nu_0))=\alpha_0$ and $\alpha'(\delta(\nu_0))=0$, the value of the parameter $\alpha$ may be constrained at two selected fractional variations $\alpha(\delta(\nu_1))=\alpha_0$ and $\alpha(\delta(\nu_2))=\alpha_0$. Constraining $\alpha$ at a third value of $\delta$ may replace explicitly constraining its second derivative $\alpha''(\delta(\nu_0))=0$. As is known to those skilled in the art, constraining $\alpha(\delta(\nu))=\alpha_0$ at some number p of different values of $\delta$ within a range will implicitly require that p−1 derivatives of a must also vanish within that same range of $\delta$, so that this procedure is equivalent to constraining the higher derivatives explicitly at some values of $\delta$.

In the case of a compound retarder 20 comprising single element retarders 10 that vary in frequency to first order, a resultant parameter that is constrained to its characteristic value at p values of the fractional variation δ is also constrained to its characteristic value at p values of the frequency. In the case where the single element retarders 10 are invariant in frequency to first order, a resultant parameter that is constrained to its characteristic value at p values of the fractional variation δ is also constrained to its characteristic value at up to 2p values of the frequency. Similarly, in the case where the single element retarders 10 are invariant in frequency to second order, a resultant parameter that is constrained to its characteristic value at p values of the fractional variation δ is also constrained to its characteristic value at up to 3p values of the frequency. The solutions at multiple selected frequencies, termed "bandwidth optimized," allow a given performance specification for $|\alpha-\alpha_0|$ over the widest possible bandwidth. Typically the bandwidth optimization solutions differ slightly from the maximally flat solution.

Compound Circular Polarizer

The action of a right-handed circular polarizer is to couple a linearly polarized input signal of $V_{x,in}$ to output signals $V_{x,out}$ and $V_{y,out}$ of equal amplitudes but with a −90° relative phase shift. In terms of the resulting parameters defined above, r=1 and (β−α)=−90° are the characteristic values for a circular polarizer. Two parameters may be constrained in Eq. 17. By the unitarity of the matrix $S_{compound}$, the alternative linear input $V_{y,in}$ is coupled to left-handed circular polarization. The unconstrained parameter represents a relative phase shift between the right- and left-circular signals. The leakage of a right-handed circular polarizer, $D_R$, may be defined as the complex voltage amplitude of the left-handed circular response, which in terms of the matrix components of Eq. 10 is as in Eq. 20:

$$D_R = \frac{1}{\sqrt{2}}(S_1 - iS_2) \quad \text{(Eq. 20)}$$

The axial ratio for this leakage is found from Eq. 1.

In another preferred embodiment, constraints may be imposed on the leakage to solve for the retardation phases and orientation angles of the individual single element retarders 10. The resulting 2n constraint equations, similar to Eq. 15, may be obtained from the constraint of having no leakage at the selected frequency. In a further preferred embodiment, the real and imaginary parts (and some of their derivatives) of the leakage are chosen to be zero at the specific frequency as in Eq. 21:

$$x=\mathrm{Re}(D_R)\ x_0=0$$

$$y=\mathrm{Im}(D_R)\ y_0=0 \quad \text{(Eq.21)}$$

This procedure is equivalent to constraining parameters r and (β−α). Because there are two parameters for an n-element compound circular polarizer 20, the 2n equations may constrain the parameter values and their first n−1 derivatives. It should be understood, however, that the present invention is not limited to the selection of x and y as in Eq. 19 for the right-handed circular polarizer 20. For example, for a compound retarder 20 that is designed to output radiation of a specified linear polarization or elliptical polarization, the variables x and y, and the constraints thereon, may be defined in terms of the leakages of the unwanted orthogonal polarization state.

Table 1 recites the retardation phases and orientation angles for a single element circular polarizer 10, a two-element circular polarizer 20, a three-element circular polarizer 20, and a four-element circular polarizer 20 derived by the method described above. Table 1 also lists the resulting parameters that are constrained to arrive at these solutions. The retardation phases and orientation angles were obtained by solving the constraints using a numerical search method on a computer. By the methods described above, such compound circular polarizers 20 are designed to have maximally flat frequency response and a broad bandwidth.

TABLE 1

| n | constrained | $\Delta\phi_{01}$ | $\theta_1$ | $\Delta\phi_{02}$ | $\theta_2$ | $\Delta\phi_{03}$ | $\theta_3$ | $\Delta\phi_{04}$ | $\theta_4$ |
|---|---|---|---|---|---|---|---|---|---|
| 1 | x,y, | 90° | 45° | | | | | | |
| 2 | x,y,x',y' | 180° | 15° | 90° | 75° | | | | |
| 3 | x,y,x',y',$x^n$,$y^n$ | 180° | 6.05° | 180° | 34.68° | 90° | 102.27° | | |
| 4 | x,y,x',y',$x^n$,$y^n$,$x^m$,$y^m$ | 180° | 23.13° | 180° | 151.80° | 180° | 53.53° | 90° | 74.71° |

The single element design, listed for comparison in Table 1, is the conventional circular polarizer 10 formed from a single element quarter-wave retarder 10 oriented at 45°. Each of the designs of Table 1 also work if the orientation angle of every element is reflected $\theta_i \rightarrow \pi/2-\theta_i$. Further designs may be found for two-, three-, and four-element circular polarizers 20 from the solutions to the simultaneous constraint equations, but such additional solutions result in compound circular polarizers 20 that have greater total retardation phases $\Sigma_i\Delta\phi_i$. A greater total retardation phase results in a compound circular polarizer 20 that has longer total physical length and therefore has greater internal losses.

Figure 3:
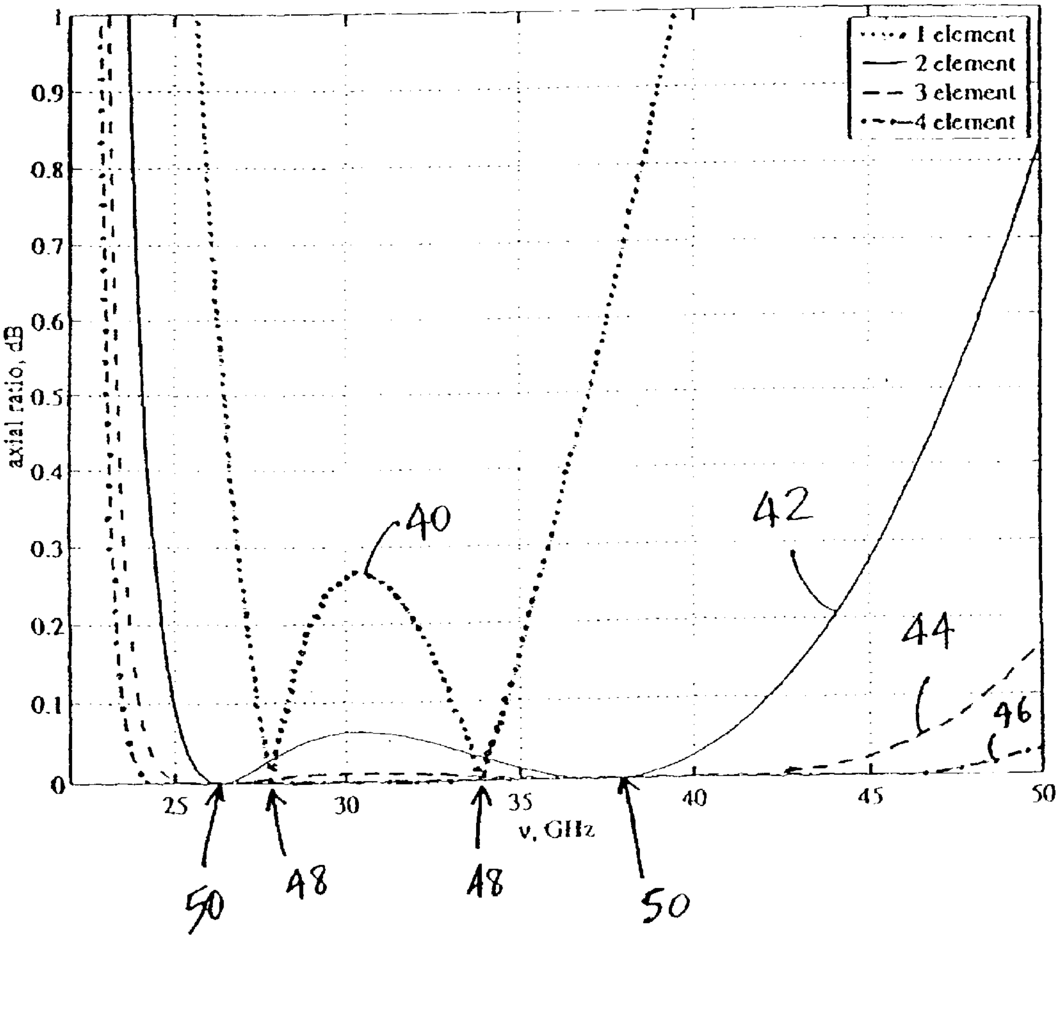
FIG. 3 is a diagram illustrating the frequency responses of a single element circular polarizer of FIG. 1 and compound circular polarizers of FIG. 2.

FIG. 3 is a diagram illustrating the frequency responses of a single element circular polarizer 10 of FIG. 1 and compound circular polarizers 20 of FIG. 2. The waveguides 12, 28, 32, 36 of the circular polarizers 10, 20 are chosen to pass radiation in at least the 26–36 GigaHertz ("GHz") microwave band for application in microwave radio astronomy. It should be understood, however, that the present invention is not limited to the above microwave band and application, and that the methods and apparatus described above work in other frequency bands for which a dual-polarization waveguide is used, such as microwave, millimeter-wave, and submillimeter-wave frequency bands, and for other applications, such as telecommunications, satellite communication, and radar.

The response of the single element circular polarizer 10, such as those in the prior art, is shown by the dotted line 40 of FIG. 3. The axial ratio vanishes at two frequencies 48 and is less than approximately 0.26 dB between these frequencies. Therefore there is leakage to the orthogonal polarization state over most of the bandwidth of the circular polarizer 10, which may be sufficiently high for some applications as to render the device unsuitable for that application.

The response of a two-element compound circular polarizer 20 is shown by the solid line of FIG. 3. The axial ratio vanishes at two frequencies 50 and is less than approximately 0.06 dB between these frequencies. As can be seen, the leakage is substantially less than the leakage of the single element circular polarizer 10. Moreover, the lesser leakage is over a range of frequencies that is more than double the range of the single element circular polarizer 10. Even lower leakage and larger bandwidth is achieved by the three-element circular polarizer response 44 and the four-element circular polarizer response 46.

Two-Element Compound Circular Polarizer

Figure 4:
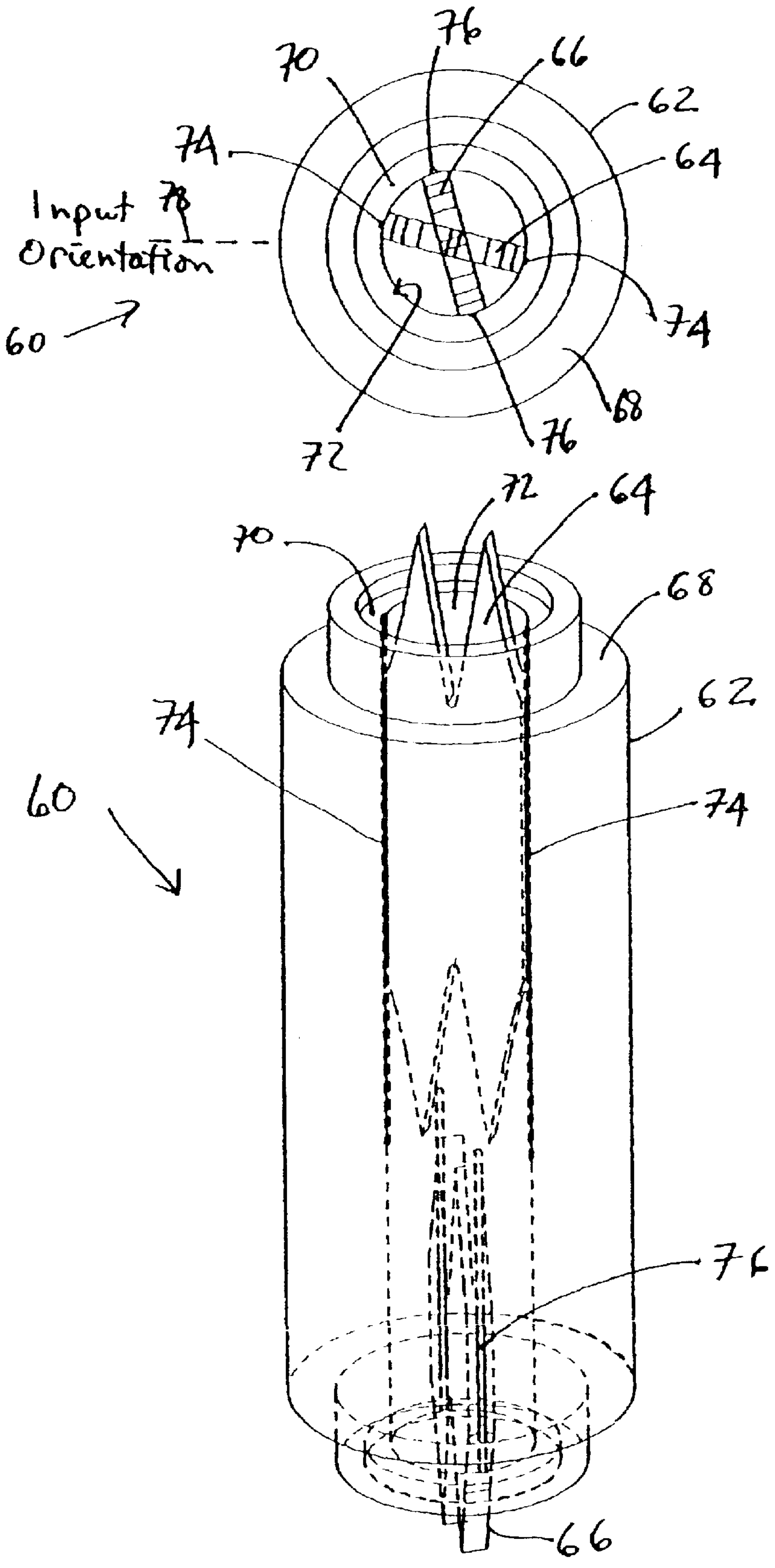
FIG. 4 is a diagram illustrating a configuration of a two-element compound circular polarizer operating in the 26–36 GHz microwave band.

FIG. 4 is a diagram illustrating a configuration of a two-element compound circular polarizer 60 operating in the 26–36 GHz microwave band. The circular polarizer 60 disclosed in FIG. 4 was designed for a specific astrophysical application, namely the Degree Angular Scale Interferometer ("DASI") that measures the polarization of the cosmic microwave background radiation. The circular polarizer 60 comprises a circular waveguide 62, within which is a half-wave retarder element 64 followed by a quarter-wave retarder element 66. The half-wave 64 and quarter-wave 66 retarder elements are chosen by the results of Table 1. The orientation angle of the half-wave retarder element 64 is 15° to the input orientation 78 and the orientation angle of the quarter-wave retarder element 66 is 75° to the input orientation 78 from the results of Table 1 for a right-handed circular polarizer 60. The retarder elements 64, 66 are shaped dielectric slabs and are integrated into the single continuous circular waveguide section 62 without any spacers or gaps that break the continuity of the waveguide section 62.

Radiation that is linearly polarized along the input orientation 78 and received by the circular polarizer 60 at the end of the waveguide section 62 adjacent to the half-wave retarder element 64 will be transmitted at the other end as right-handed circularly polarized radiation. Additionally, right-handed circularly polarized radiation that is received by the circular polarizer 60 at the end of the waveguide section 62 adjacent to the quarter-wave retarder element 66 will be transmitted at the other end as radiation that is linearly polarized along the input orientation.

In one preferred embodiment, the circular waveguide section 62 is machined from brass, and is gold-plated to enhance conductivity of the inner walls. Each end of the waveguide section 62 incorporates an outer step 68 that forms a race for a ball bearing, allowing the section 62 to rotate freely. A gear (not shown) is fixed to the outer diameter of the waveguide section 62 to allow it to be driven to any desired orientation. Each end of the waveguide section 62 also incorporates an inner step 70 to prevent leakage of microwave power. It should be understood, however, that the present invention is not limited to gold-plated brass and that other conductive materials may be used to fabricate the waveguide 62, such as aluminum, copper, silver, nickel, or superconducting materials such as niobium. It should further be understood that the above-described configuration of the waveguide 62 is for the DASI application and that other configurations of the waveguide 62 are possible that are consistent with the particular application to which the circular polarizer 60 is put.

The inner walls 72 of the waveguide section 62 are broached with two pairs of precise grooves, a long pair of grooves 74 and a short pair of grooves 76, set at 60° from each other. These hold and define the orientation angles of the dielectric slab retarder elements 64, 66. The structure of the first retarder element 64 imposes a retardation phase of $\Delta\phi_{01}=180°$ and slides into the long pair of grooves 74. The structure of the second retarder element 66 imposes a retardation phase of $\Delta\phi_{02}=90°$ and slides into the short pair of grooves 76 from the opposite end of the waveguide section 62. When the gear is driven to rotate the waveguide section 62 so that the long pair of grooves 74 holding the structure of the first element 64 are at $\theta_1=15°$ from the input orientation 78, the structure of the second element 66 is at $\theta_2=75°$ and the compound device 62 output couples to right-handed circular polarization. When the gear rotates the waveguide section 62 so that the first element 64 is oriented at $\theta_1=-75°$, the second element 66 is oriented at $\theta_{2=-15}°$ and the compound device 60 output couples to left handed circular polarization.

In one preferred embodiment, the two retarder elements or structures 64, 66 are dielectric slabs made from polystyrene. Polystyrene has low dielectric loss, dimensional stability, and is easily machined. It should be understood, however, that other dielectric materials may be used for the structures 64, 66, such as teflon, polyethylene, fused quartz, composite dielectrics, or anisotropic dielectrics.

The structures 64, 66, however, may in general reflect radiation from the ends of the slabs 64, 66, and may excite additional modes of the waveguide 62. In one preferred embodiment, in order to improve matching with other waveguides and minimize reflections at the ends of the slabs 64, 66, the profiles of those ends taper to points, as illustrated in FIG. 4. Further, the dual-pointed profile of the slabs 64, 66 eliminates excitation of an unwanted $TM_{11}$ mode of the waveguide 62. In the embodiment depicted in FIG. 4, the edges of the slabs 64, 66 may be provided with ridges that fit into the grooves 74, 76 of the waveguide section 62, and the slabs 64, 66 may be secured in place with epoxy. It should be understood, however, that the present invention is not limited to the dual-pointed profile of FIG. 4 and that other profiles of the structures 64, 66 are possible. For example, the profile may be single pointed or wedged. Additionally, it should be understood that the present invention is not limited to slabs 64, 66 in the waveguide 62 for imposing the retardation phase on the radiation. For example, the retardation phase may be imposed by changes in the height-to-width ratio of the walls of the waveguide 62 (for example, by forming an elliptical or rectangular cross-section), and by irises, transverse corrugations, longitudinal grooves or ridges, and posts introduced into the waveguide 62.

Figure 5:
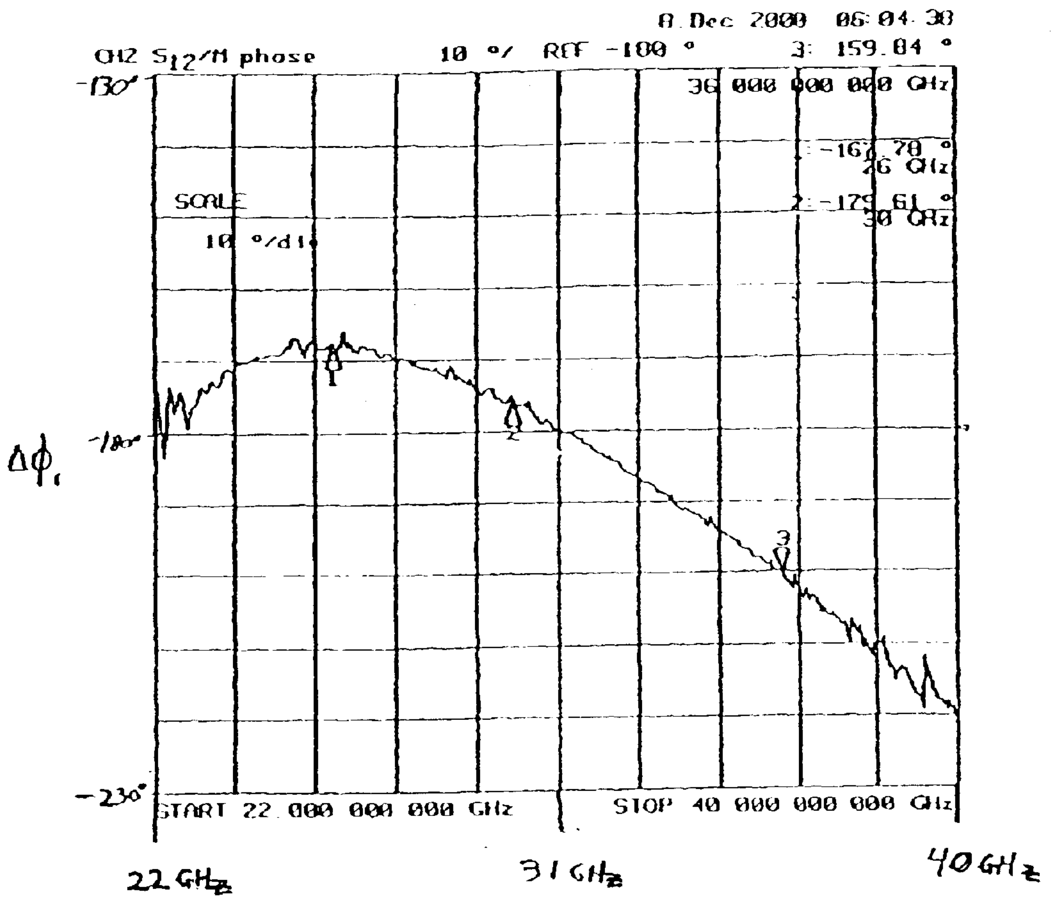
FIG. 5 is a diagram illustrating the dependence of the retardation phase on frequency for the first structure in the compound circular polarizer of FIG. 4.
Figure 6:
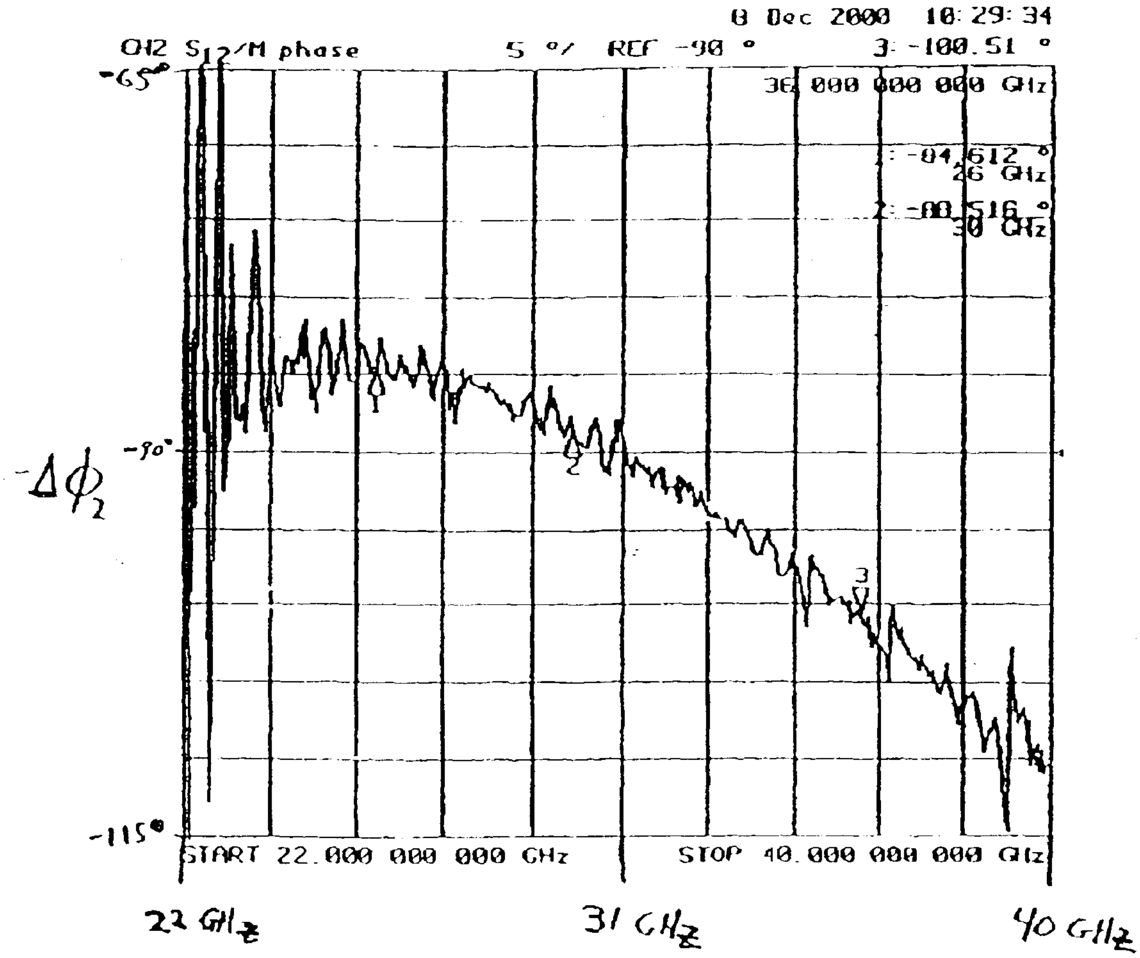
FIG. 6 is a diagram illustrating the dependence of the retardation phase on frequency for the second structure in the compound circular polarizer of FIG. 4.

FIG. 5 is a diagram illustrating the dependence of the retardation phase on frequency for the first structure 64 in the compound circular polarizer 60 of FIG. 4. The retardation curve $\Delta\phi_1(\nu)$ was measured using a Hewlett Packard HP8722D vector network analyzer. The relative phase shift between signals with electric fields oriented parallel to and perpendicular to the slab 64 was measured by differencing the propagation phases with the slab 64 in each of these positions. FIG. 6 is a diagram illustrating the dependence of the retardation phase on frequency for the second structure 66 in the compound circular polarizer 60 of FIG. 4. This retardation curve $\Delta\phi_2$ $(\nu)$ was measured using the same method as that of FIG. 5. The fractional variation dependence on frequency $\delta(\nu)$ is well matched for these two retarders 64, 66. The fractional variation $\delta(\nu)$ vanishes to first order at the selected frequency $\nu_0\approx26$ GHz. The cancellation of this fractional variation between the two retarders 64, 66 in the compound configuration 60 of FIG. 4 yields a compound circular polarizer 60 whose performance is highly accurate over a broad band of frequencies. Further, the return loss from the dielectric slabs 64, 66 was found to not exceed −20 dB.

Figure 7:
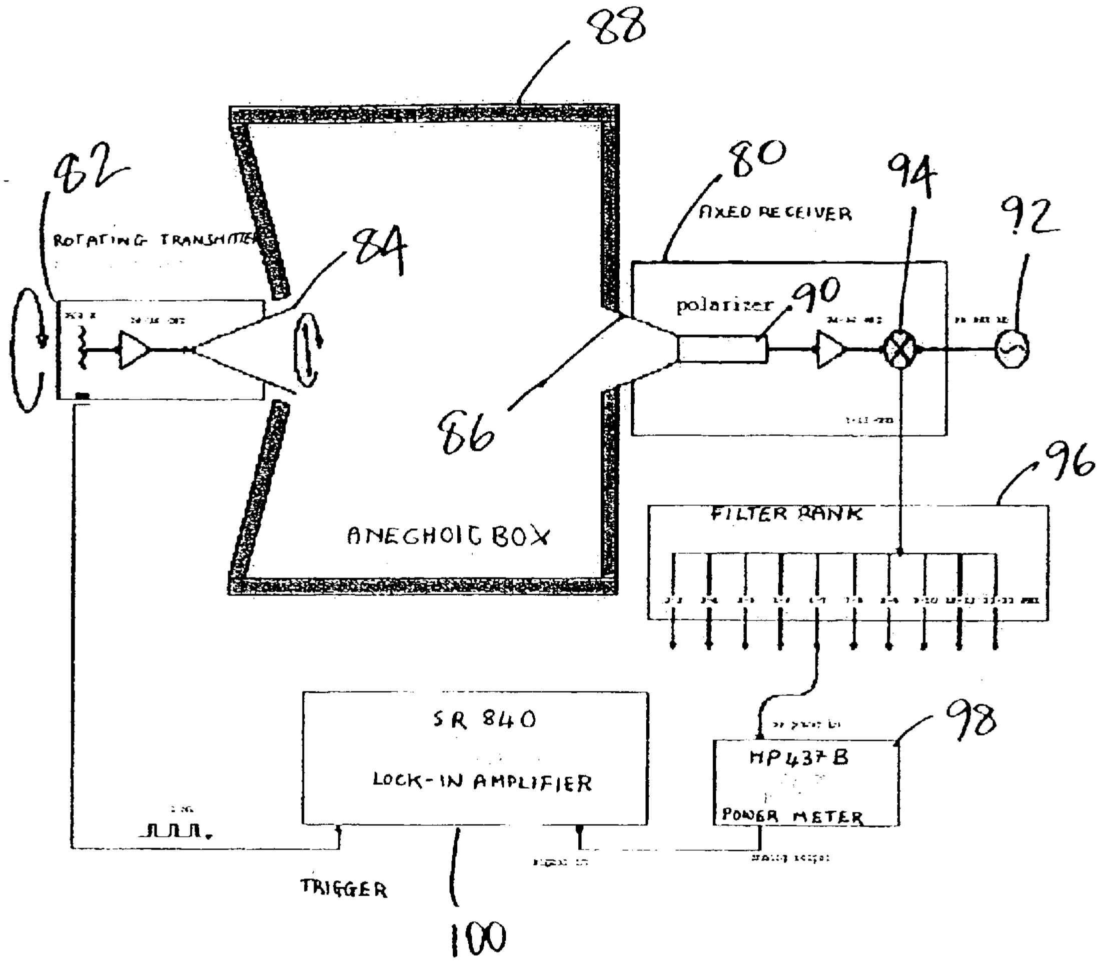
FIG. 7 is a block diagram illustrating a test set-up for measuring the performance of the compound circular polarizer of FIG. 4.

FIG. 7 is a block diagram illustrating a test set-up for measuring the performance of the compound circular polarizer 60 of FIG. 4. The performance of the complete assembled compound polarizer 60 was measured in a DASI receiver 80. A transmitter 82 that produces a strong, broadband, linearly polarized signal is rotated continuously about the axis of its horn 84 at 2 Hz (120 revolutions per minute). The horn 86 of the fixed receiver 80 couples directly to this rotating linear signal in an anechoic box 88 made of microwave absorbing material in order to eliminate multiple reflections. The power output from the receiver 80 is expected to be steady if the receiver 80 is fitted with a perfect circular polarizer 90. If the response of the circular polarizer 90 is elliptical, however, the power output from the receiver 80 will be modulated due to the changing orientation of the linear signal from the rotating transmitter 82. The power output from the receiver 80 reaches a maximum each time the rotating source 82 is aligned with the major axis of the polarization ellipse. The local oscillator 92, mixer 94, and filter bank 96 allow selection of each of ten sub bands within the 26–36 GHz frequency range in order to measure performance across the entire frequency range of the circular polarizer 90. A Hewlett Packard HP437B power meter 98 measures the microwave power output of the receiver 80 in each sub band and outputs that power level as a 0–10V signal. A Stanford Research Systems SR840 lock-in amplifier 100 measures the synchronous modulation of this signal, allowing the axial ratio and orientation of the polarizer's ellipse to be determined at each frequency.

Figure 8:
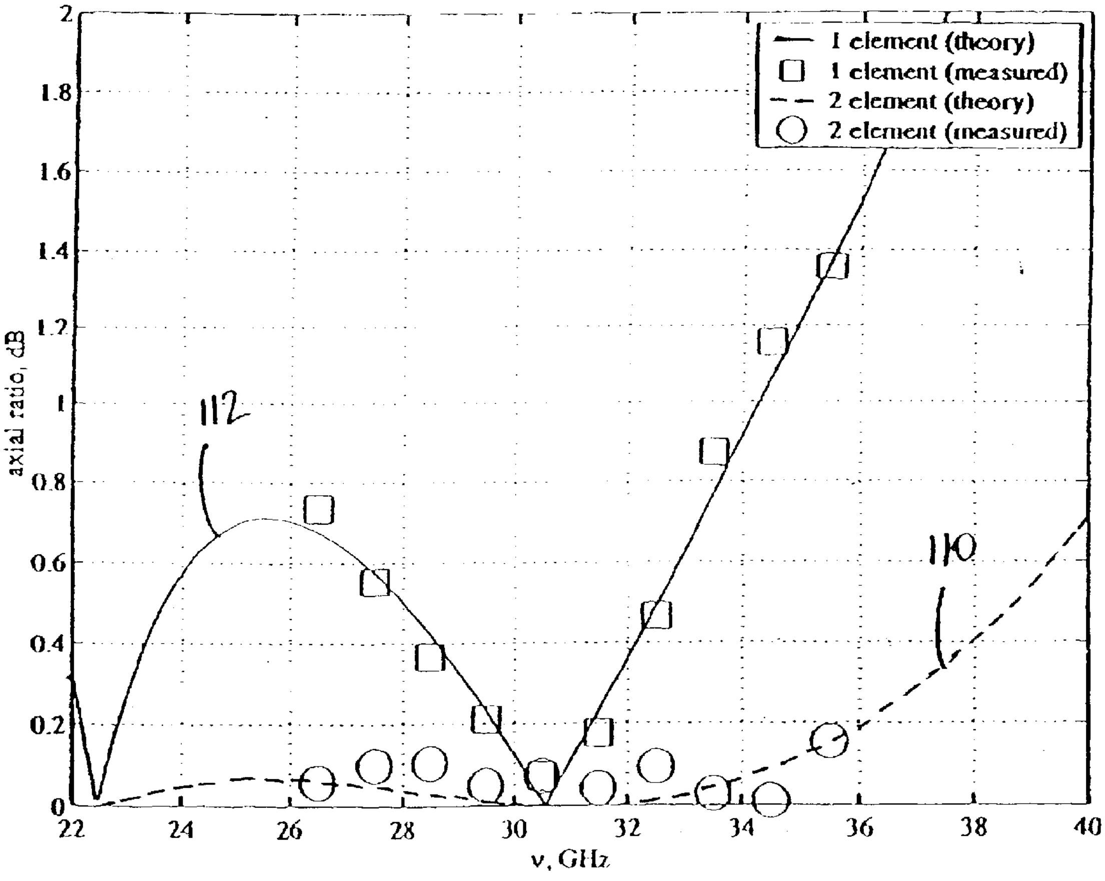
FIG. 8 is a diagram illustrating measurements of the axial ratio of the compound circular polarizer of FIG. 4 using the test set-up of FIG. 7.

FIG. 8 is a diagram illustrating measurements of the axial ratio of the compound circular polarizer 60 of FIG. 4 using the test set-up of FIG. 7. The dashed curve 110 is the theoretical prediction for the frequency dependence of the axial ratio for the two-element compound polarizer 60. The measurements of the axial ratio for the compound circular polarizer 60 using the test set-up of FIG. 7 are shown as circles in the diagram. For comparison, the theoretical prediction for the frequency dependence of a conventional single element polarizer 10, built using the same type of structure 66 as for the compound circular polarizer 60, is shown as the solid line 112. The measurements of the axial ratio for the single element circular polarizer 10 using the test set-up of FIG. 7 are shown as squares in the diagram. In both cases, the data closely match the theoretical predictions. As may be seen from FIG. 8, the axial ratio for the compound circular polarizer is less than approximately 0.1 dB over the desired bandwidth.

Quarter-Wave and Half-Wave Compound Retarders

It is known in the art that half-wave retarders may be used as linear polarization rotators, with the overall orientation angle of the device continuously variable. Similarly, it is known in the art that quarter-wave retarders may be used to alternate between circular and linear polarizations. In both these cases, the input signal may be any combination of $V_{x,in}$ and $V_{y,in}$. For applications that operate with arbitrary linear combinations of the input signals, three resultant parameters may be constrained to provide the retardation phases and orientation angles of the single element retarders 10 that comprise the compound retarder 20. If the third parameter is left unconstrained (as for the circular polarizers 20 described above), the orientation angle of the linear output is unconstrained and will generally vary with frequency.

For these compound retarders, three parameters may be constrained as in Eq. 22:

$$x=\mathrm{Re}(S_2)\ x_0=0$$
$$y=\mathrm{Im}(S_2)\ y_0=0 \quad \text{(Eq. 22)}$$
$$z=2\arg(S_1)=\Delta\phi_{eff}$$

For quarter-wave compound retarders 20, the characteristic retardation phase is constrained to $z_0=\pi/2$. For half-wave compound retarders, the constraint is $z_0=\pi$. For compound retarders 20 with a specified overall characteristic phase other than a quarter-wave or half-wave, $z_0$ is constrained to take other values equal to the specified phase. Constraining three resulting parameters for an n-element compound retarder may require a different selection of which higher derivatives to constrain compared to the constraints for the n-element circular polarizers 20 of Table 1.

Table 2 recites the retardation phases and orientation angles for a single element quarter-wave retarder 10, a two-element quarter-wave retarder 20, a three-element quarter-wave retarder 20, and a four-element quarter-wave retarder 20 derived by the methods described above. Table 2 also lists the resulting parameters that are constrained to arrive at these solutions. The retardation phases and orientation angles were also obtained by solving the constraints using a numerical search method on a computer. By the methods described above, such compound quarter-wave retarders 20 are designed to have maximally flat frequency response and a broad bandwidth.

Similarly, Table 3 recites the retardation phases, orientation angles, and constraints for single 10 and multi-element half-wave retarders 20. These compound half-wave retarders 20 are also designed to have maximally flat frequency response and a broad bandwidth.

TABLE 2

| n | Constrained | $\Delta\phi_{01}$ | $\theta_1$ | $\Delta\phi_{02}$ | $\theta_2$ | $\Delta\phi_{03}$ | $\theta_3$ | $\Delta\phi_{04}$ | $\theta_4$ |
|---|---|---|---|---|---|---|---|---|---|
| 1 | x, y, (y = 0 also) | 90° | 0° | | | | | | |
| 2 | x, y, z, z' | 90° | 0° | 360° | 52.24° | | | | |
| 3 | x, y, z, x', y', z' | 115.18° | 30.98° | 180° | 140.28° | 115.18° | 30.98° | | |
| 4 | x, y, z, x', y', z', x", z" | 250.48° | 17.36° | 180° | 115.84° | 180° | 166.57° | 140.77° | 60.95° |

TABLE 3

| n | Constrained | $\Delta\phi_{01}$ | $\theta_1$ | $\Delta\phi_{02}$ | $\theta_2$ | $\Delta\phi_{03}$ | $\theta_3$ | $\Delta\phi_{04}$ | $\theta_4$ |
|---|---|---|---|---|---|---|---|---|---|
| 1 | x, y, (y = 0 also) | 180° | 0° | | | | | | |
| 2 | x, y, z, z' | 180° | 90° | 360° | 30° | | | | |
| 3 | x, y, z, x', y', z', | 180° | 60° | 180° | 120° | 180° | 60° | | |
| 4 | x, y, z, x', y', z', x", z" | 180° | 90° | 180° | 37.78° | 360° | 23.28° | 180° | 127.78° |

The single element designs, listed for comparison in Tables 2 and 3, are the conventional quarter- and half-wave retarders 10 formed from a single element. Each of the designs of Table 2 and 3 also work if the orientation angle of every element is reflected $\theta_i \rightarrow \Sigma/2-\theta_i$. The half-wave retarders 10, 20 also work if the orientation angle of every element is also reflected by $\theta_i \rightarrow \Sigma/2+\theta_i$. Also, further designs may be found for two-, three-, and four-element circular polarizers 20 from the solutions to the simultaneous constrain equations, but such additional solutions also result in compound quarter- and half-wave retarders 20 that have greater total retardation phases $$\sum_i \Delta\phi_i$$

and therefore greater internal losses.

It should be understood that the present invention is not limited to circular polarizers, half-wave retarders, and quarter-wave retarders. Compound retarders 20 characterized by other effective retardation phases are possible. For example, the methods described above may be used to design and construct compound retarders 20 that couple any specific input polarization state to any specific output polarization state, including elliptical polarization states. Further, using the methods described above, compound retarders 20 having rotatable elements may be designed and constructed that continuously satisfy the constraint equations over a broad frequency range and rotations of the rotatable elements.

The prior art single element retarders 10 have a property that they are symmetric about two orthogonal planes defined by the principle axes of the structure 14. In contrast, the compound retarders 20, 60 of the present invention do not necessarily possess such symmetry. For example, the circular polarizer 60 of FIG. 4 comprises structures at different orientations that break any symmetry about planes defined by axes that would correspond to the principle axes of a single element retarder 10 with the same function.

The foregoing detailed description is merely illustrative of several embodiments of the invention. Variations of the described embodiments may be encompassed within the purview of the claims. More or fewer elements or components may be used in the block diagrams. Accordingly, any description of the embodiments in the specification should be used for general guidance, rather than to unduly restrict any broader descriptions of the elements in the following claims.

We claim:

1. A compound retarder in a waveguide comprising:

n consecutive single element retarders, wherein n represents an integer number greater than one, wherein each single element retarder imposes a respective aligned retardation phase and has a respective aligned orientation angle with respect to an input orientation of the waveguide, wherein behavior of the compound retarder is parametrized by frequency dependent resultant parameters, and wherein the aligned orientation angle and aligned retardation phase for each single element retarder are selected to render at least one of the resultant parameters invariant to a higher order in variation of frequency about a selected frequency than at least one of the single element retarders.

2. The compound retarder of claim 1 wherein at least one of the single element retarders is invariant to first order in variation of frequency about a selected frequency, and wherein at least one of the resultant parameters are invariant to at least third order in variation of frequency about a selected frequency.

3. The compound retarder of claim 1 having two consecutive single element retarders, comprising:

a half-wave retarder having a first aligned retardation phase of approximately 180° and a first aligned orientation angle of approximately 15°, wherein the half-wave retarder is aligned with an input of the waveguide; and a quarter-wave retarder having a second aligned retardation phase of approximately 90° and a second aligned orientation angle of approximately 75°, wherein the quarter-wave retarder is aligned with the half-wave retarder, whereby the compound retarder is a compound circular polarizer.

4. The compound retarder of claim 1 having two consecutive single element retarders, comprising:

a half-wave retarder having a first aligned retardation phase of approximately 180° and a first aligned orientation angle of approximately −75°, wherein the half-wave retarder is aligned with an input of the waveguide; and a quarter-wave retarder having a second aligned retardation phase of approximately 90° and a second aligned orientation angle of approximately −15°, wherein the quarter-wave retarder is aligned with the half-wave retarder, whereby the compound retarder is a compound circular polarizer.

5. The compound retarder of claim 1 having two consecutive single element retarders, comprising:

a quarter-wave retarder having a first aligned retardation phase of approximately 90° and a first aligned orientation angle of approximately 0°, wherein the quarter-wave retarder is aligned with an input of the waveguide; and a full-wave retarder having a second aligned retardation phase of approximately 360° and a second aligned orientation angle of approximately 52.24°, wherein the full-wave retarder is aligned with the quarter-wave retarder, whereby the compound retarder is a compound quarter-wave retarder.

6. The compound retarder of claim 1 having two consecutive single element retarders, comprising:

a half-wave retarder having a first aligned retardation phase of approximately 180° and a first aligned orientation angle of approximately 90°, wherein the half-wave retarder is aligned with an input of the waveguide; and a full-wave retarder having a second aligned retardation phase of approximately 360° and a second aligned orientation angle of approximately 30°, wherein the full-wave retarder is aligned with the half-wave retarder, whereby the compound retarder is a compound half-wave retarder.

7. The compound retarder of claim 1 having three consecutive single element retarders, comprising:

a first half-wave retarder having a first aligned retardation phase of approximately 180° and a first aligned orientation angle of approximately 6.05°, wherein the first half-wave retarder is aligned with an input of the waveguide;

a second half-wave retarder having a second aligned retardation phase of approximately 180° and a second aligned orientation angle of approximately 34.68°, wherein the second half-wave retarder is aligned with the first half-wave retarder, a quarter-wave retarder having a third aligned retardation phase of approximately 90° and a third aligned orientation angle of approximately 102.27°, wherein the quarter-wave retarder is aligned with the second half-wave retarder, whereby the compound retarder is a compound circular polarizer.

8. The compound retarder of claim 1 having three consecutive single element retarders, comprising:

a first retarder having a first aligned retardation phase of approximately 115.18° and a first aligned orientation angle of approximately 30.98°, wherein the first half-wave retarder is aligned with an input of the waveguide;

a half-wave retarder having a second aligned retardation phase of approximately 180° and a second aligned orientation angle of approximately 140.28°, wherein the second half-wave retarder is aligned with the first retarder, a second retarder having a third aligned retardation phase of approximately 115.18° and a third aligned orientation angle of approximately 30.98°, wherein the quarter-wave retarder is aligned with the half-wave retarder, whereby the compound retarder is a compound quarter-wave retarder.

9. The compound retarder of claim 1 having three consecutive single element retarders, comprising:

a first half-wave retarder having a first aligned retardation phase of approximately 180° and a first aligned orientation angle of approximately 60°, wherein the first half-wave retarder is aligned with an input of the waveguide;

a second half-wave retarder having a second aligned retardation phase of approximately 180° and a second aligned orientation angle of approximately 120°, wherein the second half-wave retarder is aligned with the first half-wave retarder, a third half-wave retarder having a third aligned retardation phase of approximately 180° and a third aligned orientation angle of approximately 60°, wherein the third half-wave retarder is aligned with the second half-wave retarder, whereby the compound retarder is a compound half-wave retarder.

10. The compound retarder of claim 1 wherein each single element retarder comprises a dielectric slab.

11. The compound retarder of claim 10 wherein the dielectric slab is selected from the group consisting of polystyrene, polytetrafluoroethylene, polyethylene, and fused quartz.

12. The compound retarder of claim 11 wherein the dielectric slab comprises polystyrene.

13. The compound retarder of claim 1 wherein each single element retarder comprises a structure selected from the group consisting of irises, transverse corrugations, longitudinal grooves, longitudinal ridges, and posts.

14. The compound retarder of claim 1 wherein the waveguide comprises a conducting material.

15. The compound retarder of claim 14 wherein the conducting material is selected from the group consisting of brass, aluminum, copper, silver, and nickel.

16. The compound retarder of claim 15 wherein the conducting material comprises brass.

17. The compound retarder of claim 14 wherein the conducting material comprises a superconducting material.

18. The compound retarder of claim 1 wherein the cross section of the the waveguide is selected from the group consisting of rectangular, circular, and elliptical.

19. A method of aligning n consecutive single element retarders in a waveguide with respect to an input orientation of the waveguide to form a compound retarder, wherein n represents an integer number greater than one, the method comprising:

a) parametrizing behavior of the compound retarder to obtain frequency dependent resultant parameters;

b) computing variations of a first selection of the resultant parameters with respect to frequency to at least first order about a selected frequency;

c) constraining a second selection of the resultant parameters at the selected frequency to characteristic values for the compound retarder to obtain k first constraint equations, wherein k represents an integer number greater than zero;

d) constraining m of the variations of the resultant parameters with respect to the frequency to obtain m second constraint equations, wherein m represents an integer number greater than zero, and wherein (m+k) is at least 2n;

e) solving the first and second constraint equations to obtain n pairs of aligned retardation phases and aligned orientation angles, one pair for each of the single element retarders; and f) positioning each single retarder element in the waveguide to impose its respective aligned retardation phase at its respective aligned orientation angle with respect to the input orientation.

20. The method of claim 19 wherein step (a) comprises:

a1) expressing the resultant parameters in terms of pairs of orientation angle variables and retardation phase variables $\Delta\phi_i$, one pair for each of the single element retarders; and a2) expressing each retardation phase variable in terms of a fractional variation δ from a corresponding aligned retardation phase variable $\Delta\phi_{0i}$ according to the expression $\Delta\phi_i=[1+\delta]\Delta\phi_{0i}$.

21. The method of claim 20 wherein step (c) comprises:

c1) evaluating the second selection of the resultant parameters at δ=0 to obtain k first expressions in terms of the orientation angle variables and aligned retardation phase variables $\Delta\phi_{0i}$, wherein k represents an integer number greater than zero.

22. The method of claim 20 wherein step (b) comprises:

b1) computing variations of the first selection of the resultant parameters with respect to the fractional variation to at least first order about δ=0.

23. The method of claim 22 wherein step (d) comprises:

d1) setting m of the variations of the first selection of the resultant parameters with respect to the fractional variation to zero to obtain m second expressions in terms of the orientation angle variables and aligned retardation phase variables $\Delta\phi_{0i}$, wherein m represents an integer number greater than zero, and wherein (m+k) is at least 2n.

24. The method of claim 23 wherein step (e) comprises:

e1) satisfying the first and second expressions, wherein values of the orientation angle variables and aligned retardation phase variables $\Delta\phi_{0i}$ that satisfy the first and second expressions respectively are the aligned orientation angles and aligned retardation phases.

25. The method of claim 19 wherein the compound retarder outputs radiation with a desired polarization state, and wherein the resultant parameters comprise an amplitude of an undesired polarization state orthogonal to the desired polarization state.

26. The method of claim 25 wherein step (c) comprises constraining the amplitude to zero at the selected frequency.

27. The method of claim 19, wherein steps (b), (c), (d), and (e) are performed using a symbolic manipulation program.

28. The method of claim 19, wherein steps (b), (c), (d), and (e) are performed using a numerical method.

29. The method of claim 28, wherein the numerical method is a numerical grid search method.

30. A computer readable medium, having stored therein instructions for causing a processor to execute the steps of:

a) computing variations of a first selection of resultant parameters with respect to frequency to at least first order about a selected frequency, wherein behavior of the compound retarder is parameterized by the resultant parameters;

b) constraining a second selection of the resultant parameters at the selected frequency to characteristic values for the compound retarder to obtain k first constraint equations, wherein k represents an integer number greater than zero;

c) constraining m of the variations of the first selection of the resultant parameters with respect to the frequency to obtain m second constraint equations, wherein m represents an integer number greater than zero, and wherein (m+k) is at least 2n; and d) solving the first and second constraint equations to obtain n pairs of aligned retardation phases and aligned orientation angles, one pair for each of the single element retarders.

31. The computer readable medium of claim 30 wherein step (a) comprises:

a1) expressing the resultant parameters in terms of pairs of orientation angle variables and retardation phase variables $\Delta\phi_i$, one pair for each of the single element retarders; and a2) expressing each retardation phase variable in terms of a fractional variation $\delta$ from a corresponding aligned retardation phase variable $\Delta\phi_{0i}$ according to the expression $\Delta\phi_i=[1+\delta]\Delta\phi_{0i}$.

32. The computer readable medium of claim 31 wherein step (c) comprises:

c1) evaluating the second selection of the resultant parameters at $\delta=0$ to obtain k first expressions in terms of the orientation angle variables and aligned retardation phase variables $\Delta\phi_{0i}$, wherein k represents an integer number greater than zero.

33. The computer readable medium of claim 32 wherein step (b) comprises:

b1) computing variations of the first selection of the resultant parameters with respect to the fractional variation to at least first order about $\delta=0$.

34. The computer readable medium of claim 33 wherein step (d) comprises:

d1) setting m of the variations of the first selection of the resultant parameters with respect to the fractional variation to zero to obtain m second expressions in terms of the orientation angle variables and aligned retardation phase variables $\Delta\phi_{0i}$, wherein m represents an integer number greater than zero, and wherein (m+k) is at least 2n.

35. The computer readable medium of claim 34 wherein step (e) comprises:

e1) satisfying the first and second expressions, wherein values of the orientation angle variables and aligned retardation phase variables $\Delta\phi_{0i}$ that satisfy the first and second expressions respectively are the aligned orientation angles and aligned retardation phases.

* * * * *

UNITED STATES PATENT AND TRADEMARK OFFICE

CERTIFICATE OF CORRECTION

PATENT NO. : 6,963,253 B2 
APPLICATION NO. : 10/369154
DATED : November 8, 2005
INVENTOR(S) : John M. Kovac et al.

It is certified that error appears in the above-identified patent and that said Letters Patent is hereby corrected as shown below:

In the Claims

Column 22, in claim 19, line 6, before “behavior of the compound” delete “parametrizing” and substitute --parameterizing-- in its place.

Signed and Sealed this

First Day of May, 2007

JON W. DUDAS
*Director of the United States Patent and Trademark Office*